United States Patent [19]

Shichinohe

[11] Patent Number: 5,343,099
[45] Date of Patent: Aug. 30, 1994

[54] OUTPUT DEVICE CAPABLE OF HIGH SPEED OPERATION AND OPERATING METHOD THEREOF

[75] Inventor: Daisuke Shichinohe, Hyogo, Japan

[73] Assignee: Mitsubishi Denki Kabushiki Kaisha, Tokyo, Japan

[21] Appl. No.: 959,910

[22] Filed: Oct. 13, 1992

[30] Foreign Application Priority Data

Oct. 14, 1991 [JP] Japan .................. 3-264635

[51] Int. Cl.$^5$ .................. H03K 17/04; H03K 17/687
[52] U.S. Cl. .................. 307/571; 307/448; 307/451; 307/585
[58] Field of Search .............. 307/443, 448, 451, 469, 307/581, 584, 585, 571, 572, 544, 270, 310; 377/121, 117, 74

[56] References Cited

U.S. PATENT DOCUMENTS

| | | | |
|---|---|---|---|
| 3,684,903 | 8/1972 | Haraszti | 377/121 |
| 4,389,728 | 6/1983 | Tsuzuki | 377/117 |
| 4,473,762 | 9/1984 | Iwahashi et al. | 307/310 |
| 4,736,117 | 4/1988 | Wieser | 307/585 |
| 5,034,629 | 7/1991 | Kinugasa et al. | 307/585 |
| 5,140,195 | 8/1992 | Wakayama | 307/451 |

FOREIGN PATENT DOCUMENTS 2-162824 6/1990 Japan .

Primary Examiner—Timothy P. Callahan
Assistant Examiner—My-Trang Nu Ton
Attorney, Agent, or Firm—Lowe, Price, LeBlanc & Becker

[57] ABSTRACT

An output device is disclosed for restraining a ringing caused when the operation of a semiconductor integrated circuit device is speeded up. This output device includes first, second and third N channel transistors. The first N channel transistor has its gate electrode connected to receive an input signal, its drain electrode connected to an output terminal, and its source electrode connected to the drain electrodes of the second and third N channel transistors. The second N channel transistor has its gate electrode and drain electrode connected to each other and its source electrode grounded. The third N channel transistor has an on resistance value matching with the characteristic impedance of a load connected to the output terminal and has its source electrode grounded. When the level of the output signal is equal to or less than the threshold voltage of the second N channel transistor, the second N channel transistor is turned off, and the amount of an output current is limited by the on resistance of the third N channel transistor.

15 Claims, 10 Drawing Sheets

OUTPUT DEVICE CAPABLE OF HIGH SPEED OPERATION AND OPERATING METHOD THEREOF

BACKGROUND OF THE INVENTION

1. Field of the Invention

The present invention relates to output devices incorporated in semiconductor integrated circuit devices and responsive to an input signal for supplying a signal of high level or low level.

2. Description of the Background Art

There is a need for semiconductor integrated circuit devices capable of driving a large load at high speed because of the recent requirement for speeding-up of the operation of digital devices. In semiconductor integrated circuit devices, a large number of circuits are highly integrated on a small area of a substrate and multiple interconnection layers are formed on the substrate. Therefore, if the recent semiconductor integrated circuit devices are operated at high speed and with a large current, the interconnecting lines tend to form a so-called distributed constant circuit.

Accordingly, there is a problem that a reflected wave as well as a microwave circuit should be taken into consideration. This problem will now be described with reference to FIGS. 14 to 17.

FIG. 14 is a conventional output device in a C-MOS integrated circuit device. Referring to FIG. 14, the output device includes a P channel transistor 1P, an N channel transistor 1N, an input terminal 11 commonly connected to gate electrodes of P channel transistor and N channel transistor 1N and an output terminal 12 commonly connected to drain electrodes of P channel transistor 1P and N channel transistor 1N. P channel transistor 1P has its source electrode coupled to a power supply $V_{DD}$ and N channel transistor 1N has its source electrode coupled to a ground potential. A capacitive load 14 is connected to output terminal 12 by an interconnecting line 15. Interconnecting line 15 includes an interconnecting line or a bonding wire formed on a substrate.

In operation, P channel transistor 1P and N channel transistor 1N are complementarily turned on/off in response to an input signal. Accordingly, the output device consumes a very small amount of power.

FIG. 15 is an equivalent circuit diagram of the output device shown in FIG. 14. In the equivalent circuit diagram shown in FIG. 15, N channel transistor 1N is in an ON state, supplying a signal of "L" level to output terminal 12. Referring to FIG. 15, N channel transistor 1N includes a current source 16 and an on resistance Ron. An interconnecting line 15 connected to a load 14 includes an inductance L. Load 14 has a capacitance C.

Accordingly, "L" level output circuit constitutes a resonance circuit including on resistance Ron, inductance L and capacitance C. The resonance circuit has the following characteristic.

Suppose that a resonance frequency f0 and a quality factor in the resonance frequency is Q, then $$f0 = \frac{1}{2\pi \sqrt{LC}} \quad (1)$$

$$Q = \frac{\omega_0 L}{Ron} \quad (2)$$

wherein $\omega_0 = 2\pi f0$.

It is necessary to improve the current handling capability (namely conductance) in order to speed up the operation of the output device shown in FIG. 14. One way to improve the current handling capability is to make the channel width larger than the channel length of the gate. FIG. 16 shows an output voltage-output current characteristic with the current handling capability being thus improved. Referring to FIG. 16, (1) represents a characteristic before the current handling capability is improved, and (a) represents an on resistance value near "L" level in that case. (2) represents a characteristic with the current handling capability being improved and (b) represents an on resistance value near "L" level in that case. As is obvious from FIG. 16, the on resistance (output voltage/output current) is decreased if the current handling capability is improved. The on resistance Ron near the expected logical value ("L" level in this case) is also lowered. As can be seen from the equation (2) above, when the on resistance Ron is decreased, the value of Q becomes high and the resonance circuit is activated by the current at the time of the falling of the output signal and causes vibration. This happens when it supplies "H" level as well as "L" level. Ringing is caused at output terminal 12 by such a vibration. FIG. 17 shows an output voltage waveform at output terminal 12 at this time.

If the load is a transmission line, mismatching of the impedance tends to occur, causing ringing by reflection. The ringing presents noises in transmitting signals, resulting in generation of interference waves, i.e., spurious radiation as well as malfunction of a logic circuit system. The interference waves could cause a malfunction of other electronic appliances.

As stated above, the conventional output device presents a problem of ringing caused when the current handling capability of the output transistor is enhanced in order to speed up the operation. One way to restrain the ringing is to connect a damping resistor in series with output terminal 12. However, this is not preferable for speeding up the operation as it attenuates the output current.

Another possible way (through rate control) is to control the activation level of the resonance circuit by providing a specific value of di/dt for the rising/falling of an input signal supplied to the gate of the output transistor to reduce the change in the current of the input signal. However, this approach is not preferable in speeding up the operation since it provides a specific di/dt for the input signal.

SUMMARY OF THE INVENTION

An object of the present invention is to make it possible to drive a large load at high speed and restrain occurrence of a ringing in an output device for supplying a signal of a high level or low level from its output terminal.

In short, the output device according to the present invention is formed on a semiconductor substrate and includes a reference voltage terminal for receiving a voltage to be a reference for a low level or high level, an output terminal connected to a load and a switching device. The switching device has its end connected to the output terminal and is turned on/off in response to an input signal for bringing a signal at the output terminal to a low level or a high level.

The output device further includes a switch-off device and a current limitation device. The switch-off device is provided between the other end of the switching device and the reference voltage terminal and is turned off when the level of an output signal applied through the switching device exceeds a predetermined level.

The current limitation device and the switch-off device are connected in parallel. The current limitation device controls the amount of current at the time of transition of the output signal.

In operation, the switching device is turned on in response to an input signal, so that an output signal is applied to the switch-off device and the current limitation device through the switching device. Since the switch-off device and the current limitation device are connected in parallel, the output signal is distributed to the switch-off device and the current limitation device. The switch-off device is turned off when the level of the output signal applied through the switching device exceeds a predetermined level. After the switch-off device is turned off, the output signal is supplied to the current limitation device only.

That is, the output signal is driven according to the current handling capabilities of the switching device and the switch-off device and rapidly changes close to an expected logical level until it attains a predetermined level. Once the level of the output signal exceeds the predetermined level, the amount of current is limited by the current limitation device. As a result, the gradient of the current can be made smaller only at the point close to the end of rising or falling of the output signal. Accordingly, a ringing is prevented even if there is a load having a distributed constant.

In another aspect of the present invention, in a case where the current limitation device has a resistance which can match with a characteristic impedance of the load, the reflection coefficient is smaller, so that generation of interference waves can be restrained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
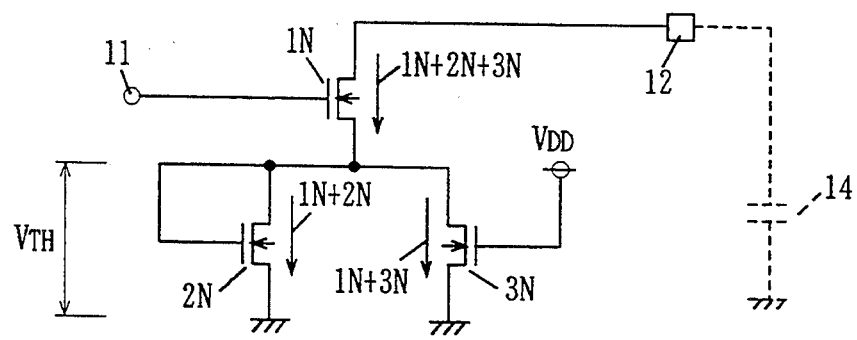
FIG. 1 is a circuit diagram showing a first embodiment of the present invention.

FIG. 1 is a circuit diagram showing one embodiment of an output device according to the present invention. The output device shown in FIG. 1 supplies a signal of "L" level. Referring to FIG. 1, the output device includes a first N channel transistor 1N, a second N channel transistor 2N and a third N channel transistor 3N. The first N channel transistor 1N has its gate electrode connected to an input terminal 11, the drain electrode connected to an output terminal 12, and the source electrode commonly connected to the drain and gate electrodes of the second N channel transistor 2N and the drain electrode of the third N channel transistor 3N. The second N channel transistor 2N has its gate electrode connected to its drain electrode, and the source electrode grounded. The third N channel transistor 3N has its gate electrode coupled to a power supply $V_{DD}$ and the source electrode coupled to a ground potential. The first N channel transistor 1N and the second N channel transistor 2N have large current handling capabilities for faster operation. The third N channel transistor 3N has its on resistance value matched with an impedance of an interconnecting line, a load or the like connected to output terminal 12.

Figure 2:
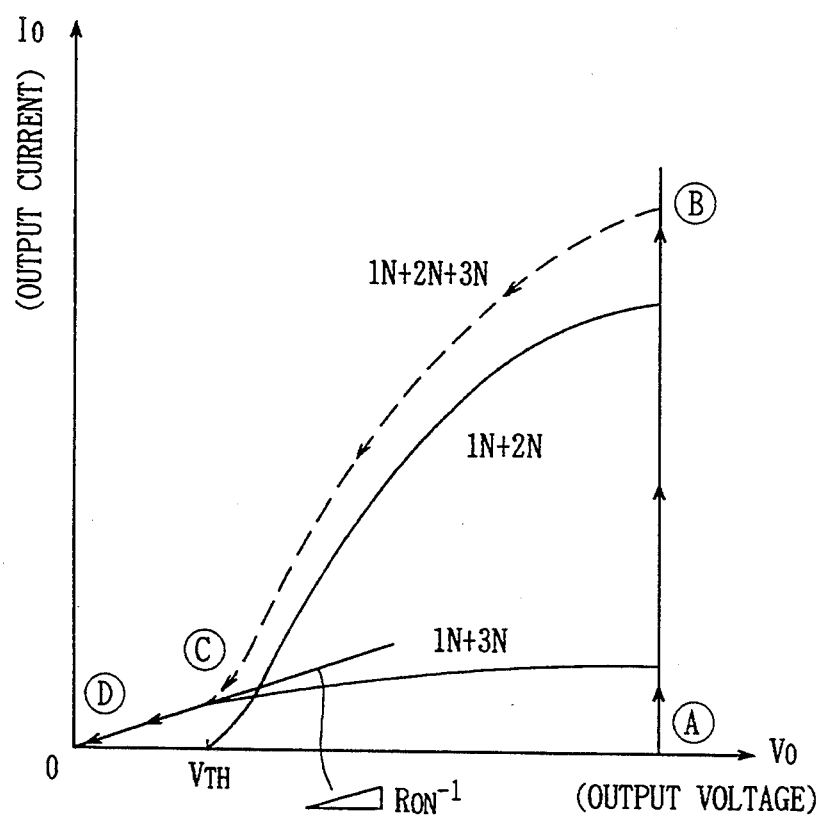
FIG. 2 is a diagram showing an output voltage-output current characteristic of the output device shown in FIG. 1.

FIG. 2 is a diagram showing an output voltage-output current characteristic of the output device shown in FIG. 1. Referring to FIG. 2, the axis of abscissas represents an output voltage V0 and the axis of ordinates represents an output current $I_0$. The line (1N+2N+3N) represents a current flowing in the channel of the first N channel transistor 1N, which flows through output terminal 12. The line (1N+2N) represents a current flowing in the channel of the second N channel transistor 2N. The line (1N+3N) represents a current flowing in the channel of the third N channel transistor 3N. A and B indicate a starting point of inversion from "H" level to "L" level, C indicates a point where the second N channel transistor 2N is turned off and D indicates an end point of output inversion.

The operation of the output device shown in FIGS. 1 and 2 will now be described.

Firstly, when an input signal attains "H" level, the first N channel transistor 1N is turned on and output terminal 12 is connected to the drain electrodes of the second N channel transistor 2N and the third N channel transistor 3N. Since the second N channel transistor 2N has its gate electrode and drain electrode commonly connected to the source of the first N channel transistor 1N, it is turned on in response to the drain voltage of the first N channel transistor 1N. The third N channel transistor 3N is in an on state all the time and a current indicated by the line (1N+2N+3N) flows in the channel of the first N channel transistor 1N during the time period B to C. The current is divided into the second N channel transistor 2N and the third N channel transistor 3N. A current indicated by the line (1N+2N) flows in the channel of the second N channel transistor 2N and a current indicated by the line (1N+3N) flows in the channel of the third N channel transistor 3N.

If the voltage of the output signal drops to a threshold voltage Vth of the second N channel transistor 2N (point C), the second N channel transistor 2N is turned off and the current from the first N channel transistor 1N flows in the third N channel transistor 3N only.

During the time period from C to D, the current is limited by the on resistance of the third N channel transistor 3N and falling of the output signal becomes moderate.

That is, during the time period from B to C, the level of the output signal is dropped rapidly by driving the load with the first and second N channel transistors having large current handling capabilities while the change in the level of the output signal is made gradual by the on resistance of the third N channel transistor 3N during the time period from C to D. Accordingly, a ringing on the output signal can be restrained.

Additionally, as the resistance of the output device is determined by the on resistance of the third N channel transistor 3N near an expected logical level (in this case "L" level), reflection can be easily prevented by impedance matching in a case where load 14 is a transmission line. An appropriate range of the on resistance is half to twice of the characteristic impedance of the load. If the on resistance is in such a range, the reflection coefficient will be 0.33 or less.

While the output device for "L" level has been described in the embodiment of FIG. 1, it is also possible to form an output device for "H" level by changing the conductivity type shown in FIG. 1 and reversing the polarity of the voltage and current.

A resistor may be employed in place of the third N channel transistor 3N shown in FIG. 1.

Figure 3:
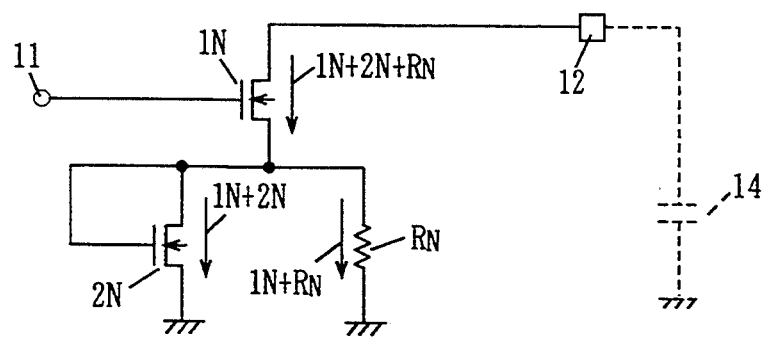
FIG. 3 is a circuit diagram showing a second embodiment of the present invention.

FIG. 3 is a circuit diagram showing a second embodiment of the present invention. Referring to FIG. 3, this output device is different from that shown in FIG. 1 in that a resistor RN is used in place of the third N channel transistor 3N. Resistor RN has its one end connected to the drain electrode of the second N channel transistor 2N and the other end grounded. The resistance value of resistor RN is a value which matches the characteristic impedance of the load, i.e., the same value as the on resistance value of the third N channel transistor 3N shown in FIG. 1.

Figure 4:
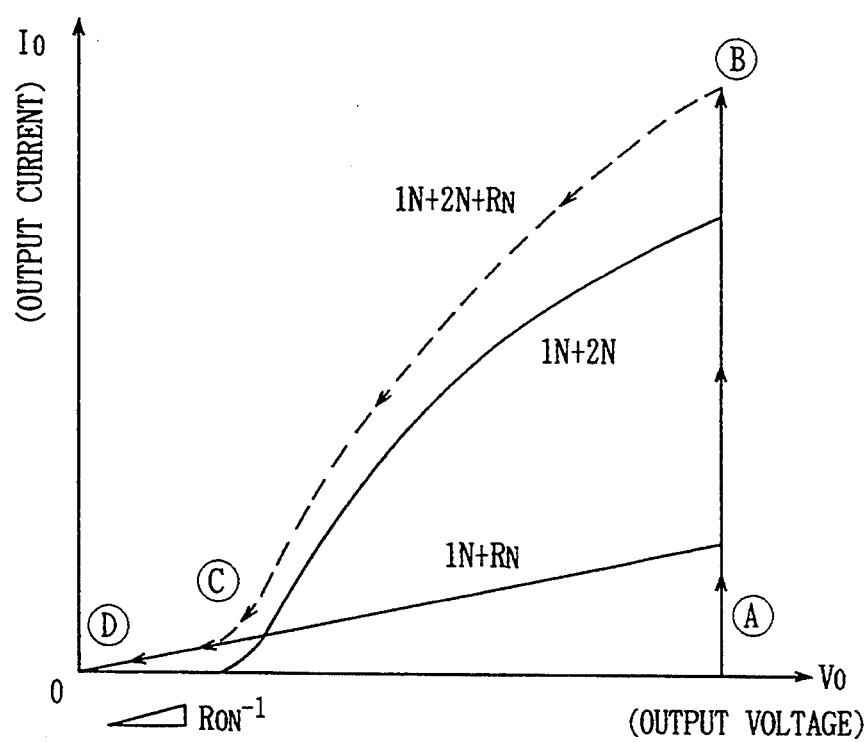
FIG. 4 is a diagram showing an output voltage-output current characteristic of the output device shown in FIG. 3.

FIG. 4 is a diagram showing an output voltage-output current characteristic of the output device shown in FIG. 3. Referring to FIG. 4, the line (1N+RN) represents a current flowing in resistor RN. Other lines are the same as those shown in FIG. 2. The line (1N+RN) is straight since the resistance value of resistor RN is constant.

In operation, most of output current flows through the second N channel transistor having a large current handling capability until the second N channel transistor 2N is turned off in the same way as in the output device of FIG. 1. After the second N channel transistor 2N is turned off, the amount of current is limited by resistor RN near "L" level of the output signal since the output current flows in resistor RN.

Accordingly, this output device attains the same effects as that of the output device shown in FIG. 1.

In a semiconductor integrated circuit device, however, a larger area is generally required for a resistor than for a transistor. The output device of FIG. 3 is formed as stated below in order to avoid an increase in area due to a resistor being provided.

Figure 5:
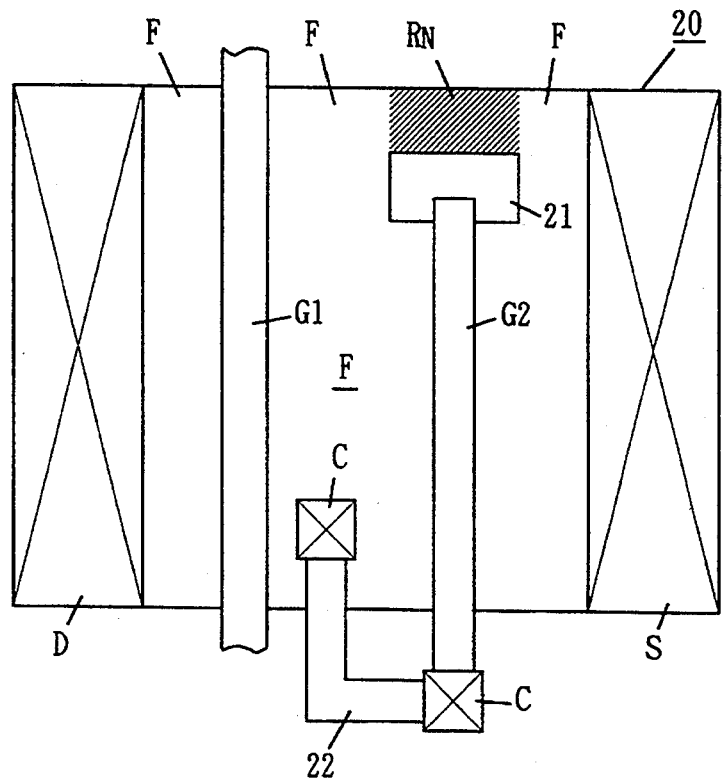
FIG. 5 is a diagram showing the output device of FIG. 4 being formed on a semiconductor substrate.

FIG. 5 is a diagram showing the output device shogun in FIG. 3 being provided on a semiconductor substrate. The output device shown in FIG. 5 includes a semiconductor substrate 20, a contact region S of a ground potential, a contact region D of an output terminal 12, a gate electrode G1 of the first N channel transistor 1N, a gate electrode G2 of the second N channel transistor 2N, a diffused resistor RN, a source-drain diffusion regions F, contact holes C, an interconnecting line 22 connecting contact holes C to each other and an interconnecting line 21 for connecting resistance RN to gate electrode G2. A channel is formed under each of gate electrodes G1 and G2. Diffusion regions F formed on both sides of each of gate electrodes G1 and G2 are sources and drains. Contact holes C are provided in the source region of the first N channel transistor 1N and the gate electrode of the second N channel transistor and are connected to each other by interconnecting line 22 including a good conductor such as aluminum. Diffused resistor RN is connected to the gate electrode G2 of the second N channel transistor 2N through interconnecting line 21. As diffused resistor RN is formed in a diffusion region constituting the first and second N channel transistors, a small area is required for providing resistor RN.

Figure 6:
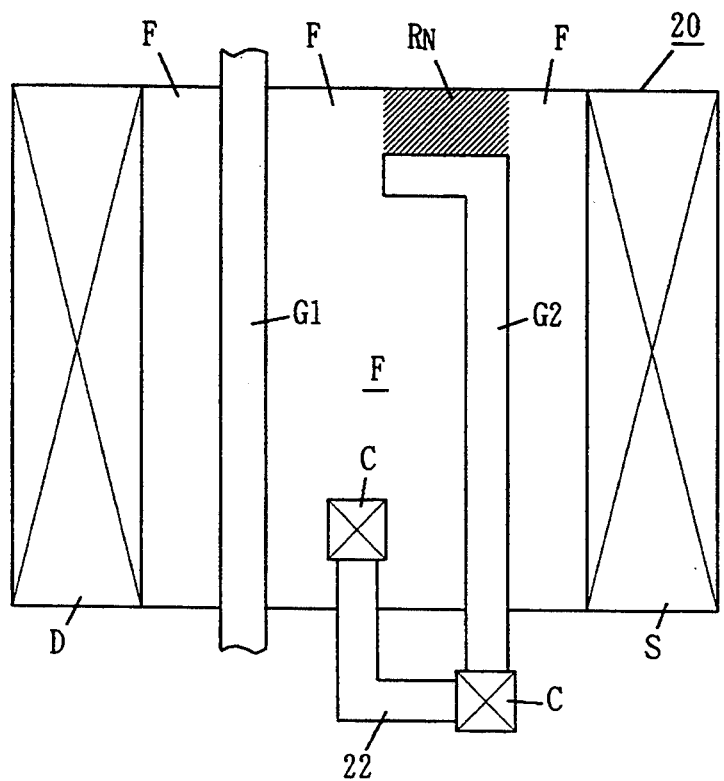
FIG. 6 is a diagram showing a modified example of the output device of FIG. 5.

FIG. 6 is a diagram showing a modified example of the output device shown in FIG. 5. The output device shown in FIG. 6 is different from that shown in FIG. 5 in that, in place of interconnecting line 21, there is provided a gate electrode G2, extending in the region of diffused resistor RN. As gate electrode G2 is directly connected to diffused resistor RN, resistor RN requires only a small area as in the output device shown in FIG. 5.

Figure 7:
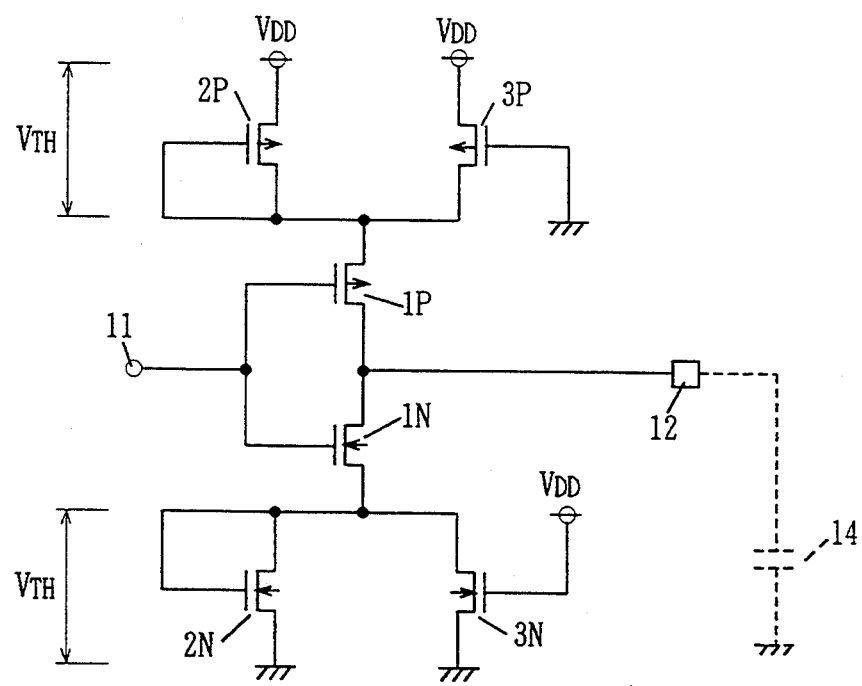
FIG. 7 is a circuit diagram showing a fourth embodiment of the present invention.

FIG. 7 is a circuit diagram showing a third embodiment of the present invention. The output device shown in FIG. 7 is different from that shown in FIG. 1 in that an output circuit for supplying a signal of "H" level is added. The output circuit for "H" level includes a first P channel transistor 1P, a second P channel transistor 2P and a third P channel transistor 3P. The gate electrode of the first P channel transistor 1P along with the gate of the first N channel transistor 1N is connected to an input terminal 11. The drain electrode of the first P channel transistor 1P along with the drain electrode of the first N channel transistor 1N is connected to an output terminal 12. The first P channel transistor 1P has its source electrode commonly connected to the drain electrodes of the second P channel transistor 2P and the third P channel transistor 3P. The second P channel transistor 2P has its gate electrode connected to its drain electrode and its source electrode coupled to a power supply. The third P channel transistor 3P has its gate electrode coupled to a ground potential and its source electrode coupled to the power supply. The first P channel transistor 1P and the second P channel transistor 2P have large current handling capabilities for speeding up the operation. The third P channel transistor 3P has its on resistance value matched with a characteristic impedance of an interconnecting line, a load or the like which is connected to output terminal 12.

The output circuit for "H" level has its conductivity type different from a polarity of the voltage and current reverse to those of the output circuit for "L" level shown in FIG. 1. Accordingly, a ringing can be restrained in output transitions from "H" level to "L" level and from "L" level to "H" level with the output circuits for "L" level and "H" level.

Figure 8:
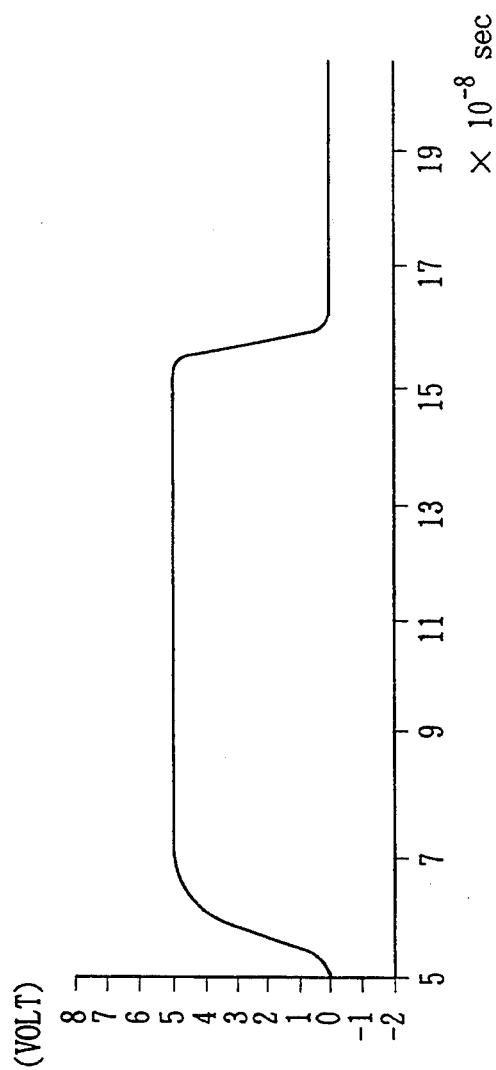
FIG. 8 is an output signal waveform diagram of the output device shown in FIG. 7.

FIG. 8 is a diagram showing an output signal waveform of the output device shown in FIG. 7. The load condition (inductance and capacitance) in FIG. 8 is the same as in FIG. 7.

Figure 9:
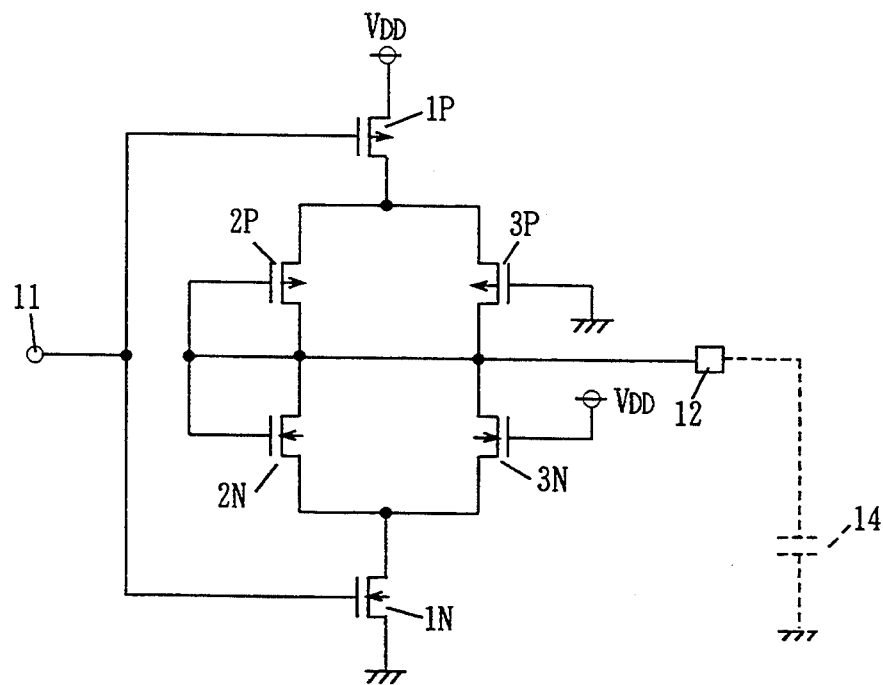
FIG. 9 is a circuit diagram showing a fourth embodiment of the present invention.

FIG. 9 is a circuit diagram showing a fourth embodiment of the present invention. Referring to FIG. 9, this output device and the output device shown in FIG. 7 differ in that the first N channel transistor 1N and the second and third N channel transistors change places with each other and the first P channel transistor 1P and the second and third P channel transistors change places with each other. In this output device as well as the output device of FIG. 7, as the current flowing from output terminal 12 to the ground potential is divided, the same effect can be achieved as in the output device of FIG. 7.

Figure 10:
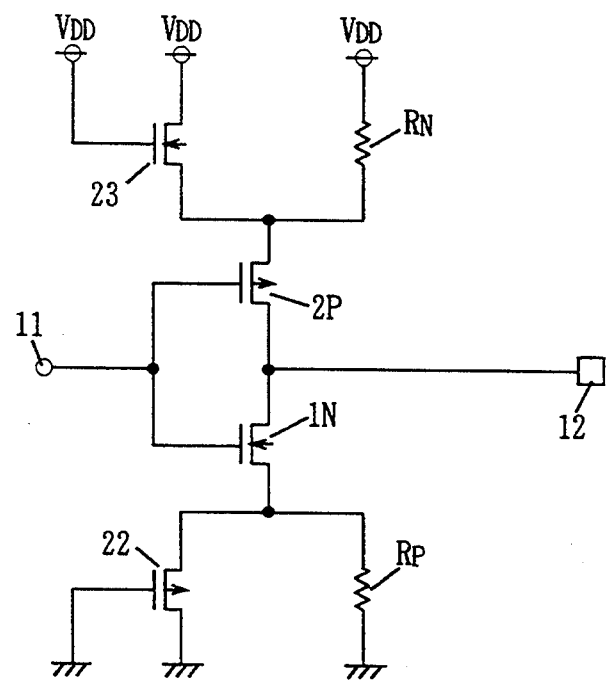
FIG. 10 is a circuit diagram showing a fifth embodiment of the present invention.

FIG. 10 is a circuit diagram showing a fifth embodiment of the present invention. Referring to FIG. 10, the output device in this figure is different from the output device of FIG. 7 in that a P channel transistor 22, an N channel transistor 23, a resistor RP and a resistor RN are provided in place of the second N channel transistor 2N, the second P channel transistor 2P, the third N channel transistor 3N and the third P channel transistor, respectively. The gate electrode and the diffusion region of P channel transistor 22 are connected to the ground potential and the gate electrode and the diffusion region of N channel transistor 23 are coupled to the power supply $V_{DD}$. Accordingly, a latch-up circuit peculiar to a C-MOS integrated circuit device is not driven by the power supply voltage. This will be described in more detail with reference to a cross-sectional view shown in FIG. 11.

Figure 11:
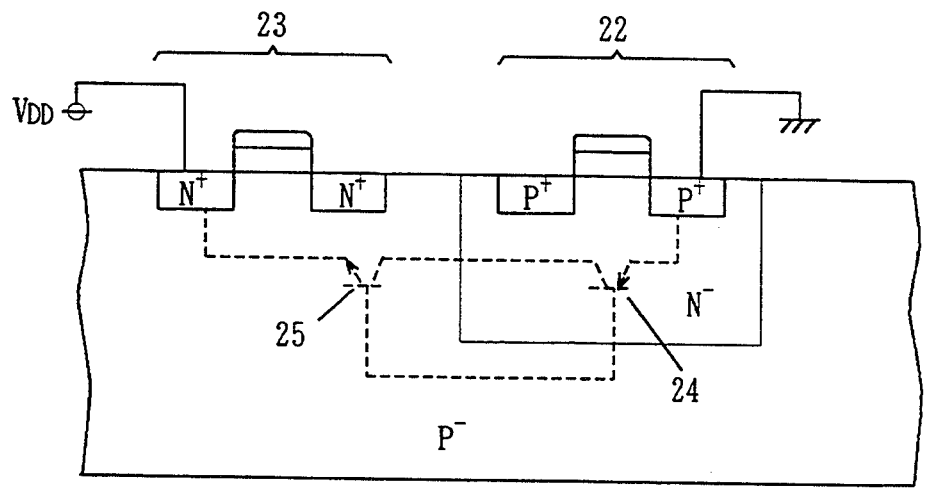
FIG. 11 is a cross-sectional view of a part of the output device shown in FIG. 10.

FIG. 11 is a cross-sectional view of a part of the output device shown in FIG. 10. Referring to FIG. 11, a pnp transistor 24 and a npn transistor 25 are parasitically formed by P channel transistor 22 and N channel transistor 23. As a result, a latch-up circuit peculiar to a C-MOS integrated circuit device is formed (see the broken line in FIG. 11). However, the diffusion region (N+) of N channel transistor 23 is coupled to the power supply $V_{DD}$ and the diffusion region (P+) of P channel transistor 22 is coupled to the ground potential. Accordingly, no current flows in pnp transistor 24 and npn transistor 25 constituting the latch-up circuit.

Therefore, this output device can prevent a latch-up.

A MOS transistor may be provided in place of resistors RP and RN in this embodiment.

Figure 12:
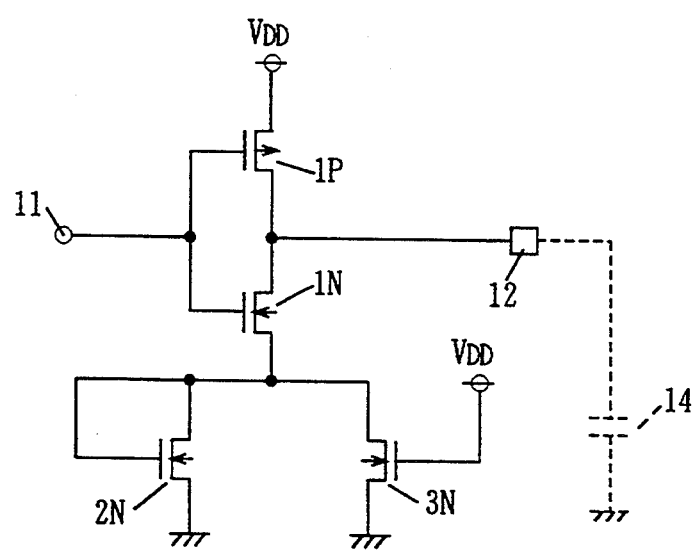
FIG. 12 is a circuit diagram showing a sixth embodiment of the present invention.

FIG. 12 is a circuit diagram showing a sixth embodiment. Referring to FIG. 12, this output device is different from the output devices shown in FIGS. 7 to 10 in that the output circuit shown in FIG. 1 is provided only for the output circuit for "L" level. This device can restrain a ringing only at "L" level of an output signal. Accordingly, this output device may be employed in driving a load which does not malfunction even if a ringing occurs on a signal of "H" level. In this way, the output circuits for "L" level and "H" level can be independently combined with another output circuit.

Additionally, an open drain output device may be obtained by eliminating P channel transistor 1P from the circuit of FIG. 12.

As stated above, the output device according to the present invention may be applied to an N channel MOS output circuit or a P channel MOS output circuit as well as a complementary output circuit.

Figure 13:
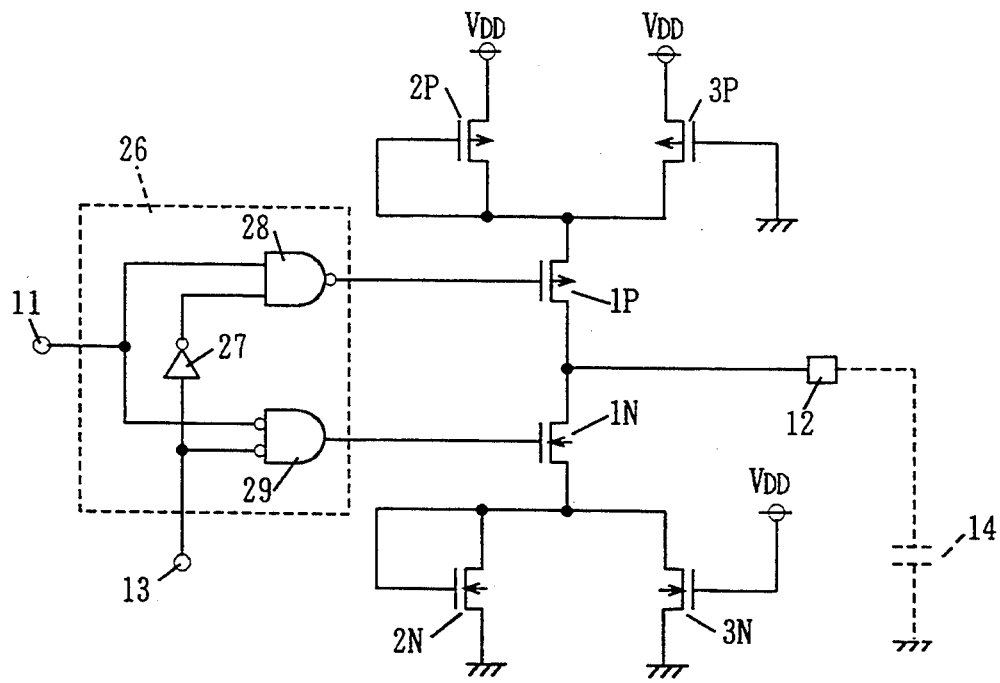
FIG. 13 is a circuit diagram showing a seventh embodiment of the present invention.
Figure 14:
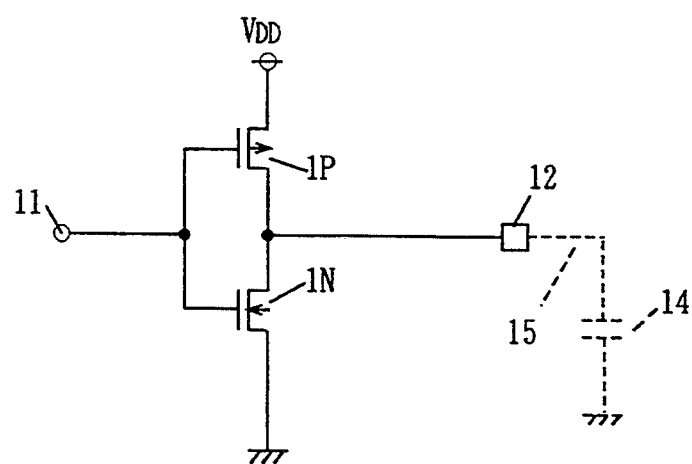
FIG. 14 is a conventional output device in a C-MOS integrated circuit device.
Figure 15:
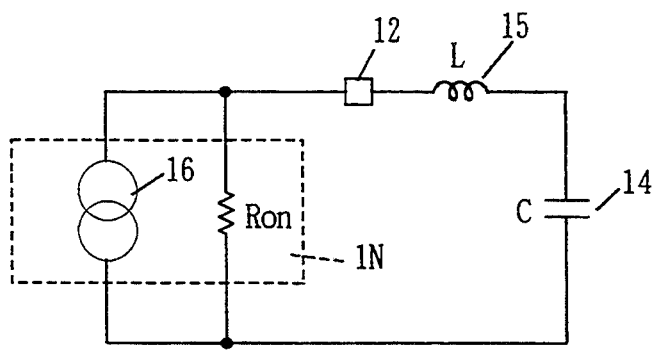
FIG. 15 is an equivalent circuit diagram of the output device shown in FIG. 14.
Figure 16:
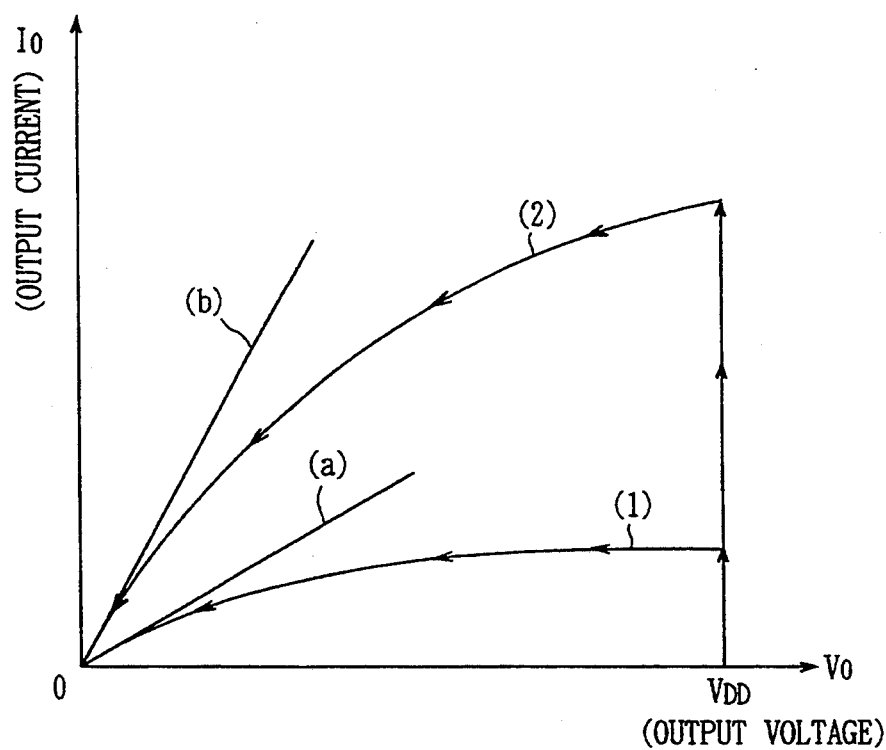
FIG. 16 is an output voltage-output current characteristic diagram of the output device shown in FIG. 14.
Figure 17:
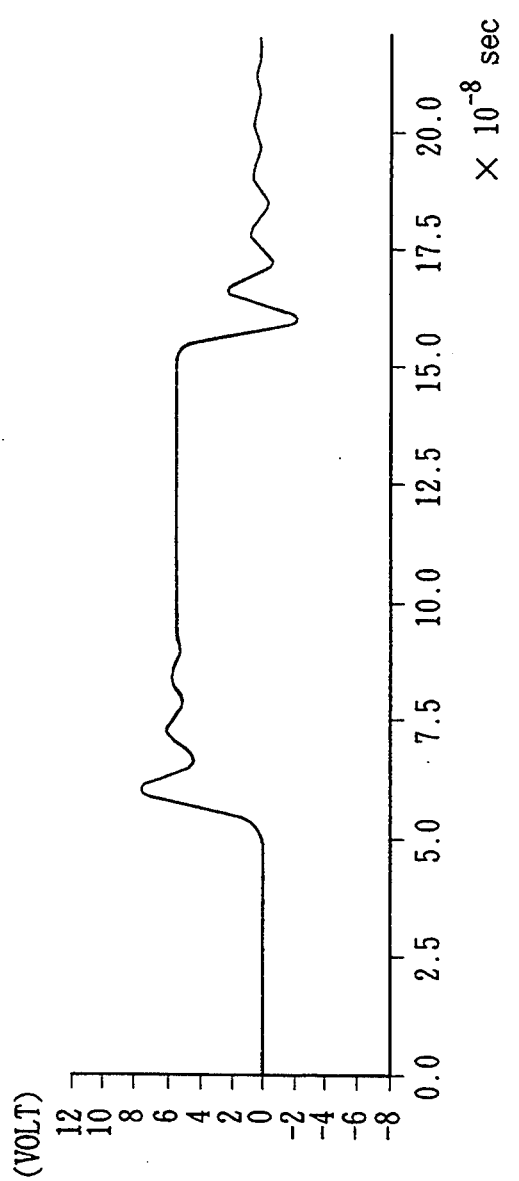
FIG. 17 is an output signal waveform diagram of the output device shown in FIG. 14.

FIG. 13 is a circuit diagram showing a seventh embodiment of the present invention. This output device is different from that of FIG. 7 in that a control circuit 26 for generating high impedance state is connected to the gate electrodes of the first P channel transistor 1P and the first N channel transistor 1N. Control circuit 26 includes an inverter 27, a NAND gate 28, a NOR gate 29 and a control terminal 13 for receiving a control signal for generating a high impedance state.

In operation, if a signal of "H" level is applied to control terminal 13, NAND gate 28 supplies a signal of "H" level and NOR gate 29 provides a signal at "L" level. Accordingly, the first N channel transistor 1N and the first P channel transistor 1P are turned off. As a result, output terminal 12 is brought to a high impedance state.

If a signal at "L" level is supplied to control terminal 13, NAND 28 and NOR gate 29 pass a signal supplied from input terminal 11 as it is to the gates of the first N channel transistor 1N and the first P channel transistor 1P.

Although the output device shown in FIG. 13 is connected to the control circuit in order to bring the output terminal to the high impedance state, it is also possible to connect the output device to another kind of control circuit instead.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output device formed on a semiconductor substrate, comprising:
    an input terminal for receiving an input signal;
    a reference voltage terminal for receiving a reference voltage;
    an output terminal connected to a load;
    a first transistor means having its drain electrode connected to said output terminal and its gate electrode connected to said input terminal, said first transistor means being switched in response to said input signal such that the potential on said output terminal is brought to said reference voltage level;
    a second transistor means having its drain electrode and gate electrode connected to the source electrode of said first transistor means and its source electrode connected to said reference voltage terminal, said second transistor means being turned off when the level of the output signal supplied through said first transistor means exceeds a predetermined threshold; and
    current limitation means connected in parallel with said second transistor means for limiting the amount of current passing through said first transistor means when said second transistor means is turned off.

2. The output device according to claim 1, wherein each of said first transistor means and said second transistor means comprises a MOS transistor having a current handling capability to drive a load at high speed.

3. The output device according to claim 1, wherein said predetermined level is a threshold voltage of said second transistor means.

4. The output device according to claim 1, wherein said current limitation means has a resistance which can match with the characteristic impedance of the load.

5. The output device according to claim 4, wherein said current limitation means includes a MOS transistor and said resistance is a source-drain resistance when the MOS transistor is saturated.

6. The output device according to claim 1, wherein each of said first transistor means and said second transistor means includes a MOS transistor and said current limitation means includes a diffused resistor so formed as to be in contact with the gate electrode of the MOS transistor included in said second transistor means.

7. An output device formed on a semiconductor substrate, comprising:
an input terminal for receiving an input signal;
a first reference voltage terminal for receiving a first reference voltage;
a second reference voltage terminal for receiving a second reference voltage;
an output terminal connected to a load;
a first MOS transistor having its drain electrode connected to said output terminal and its gate electrode connected to said input terminal, said first MOS transistor being switched in response to said input signal such that the potential on said output terminal is brought to said second reference voltage level;
a second MOS transistor having its drain electrode and gate electrode connected to the source electrode of said first MOS transistor and its source electrode connected to said first reference voltage terminal, said second MOS transistor being turned off if the level of the output signal supplied through said first MOS transistor means exceeds a predetermined threshold; and
a third MOS transistor connected in parallel with respect to said second MOS transistor and having its gate electrode connected to said second reference voltage terminal, said third MOS transistor being turned on in response to said second reference voltage and generating drain-source resistance to match the characteristic impedance of said load,
wherein said first and second MOS transistors have current handling capabilities such that they drive said load at high speed.

8. The output device according to claim 7, wherein said first, second and third MOS transistors have the same conductivity type.

9. The output device according to claim 7, wherein one of said first, second and third MOS transistors has a conductivity type different from that of other MOS transistors.

10. An output device formed on a semiconductor substrate, comprising:
an input terminal for receiving an input signal;
a reference voltage terminal for receiving a reference voltage;
an output terminal connected to a load;
a high level output circuit for supplying a signal of high level to said output terminal; and
a low level output circuit for supplying a signal of low level to said output terminal,
wherein at least one of said high level output circuit and said low level output circuit comprises:
a first transistor means having its drain electrode connected to said output terminal and its gate electrode connected to said input terminal, said first transistor means being switched in response to said input signal such that the potential on said output terminal is brought to said reference voltage level;
a second transistor means having its drain electrode and gate electrode connected to the source electrode of said first transistor means and its source electrode connected to said reference voltage terminal, said second transistor means being turned off when the level of the output signal supplied through said first transistor means exceeds a predetermined threshold; and
means connected in parallel with said second transistor means for limiting the amount of current passing through said first transistor means when said second transistor means is turned off.

11. An output device formed on a semiconductor substrate, comprising:
an input terminal for receiving an input signal;
a first reference voltage terminal for receiving a first reference voltage;
a second reference voltage terminal for receiving a second reference voltage;
an output terminal connected to a load;
a high level output circuit for supplying a signal of high level to said output terminal; and
a low level output circuit for supplying a signal of low level to said output terminal,
wherein at least one of said high level output circuit and said low level output circuit comprises:
a first MOS transistor having its drain electrode connected to said output terminal and its gate electrode connected to said input terminal, said first MOS transistor being switched in response to said input signal such that the potential on said output terminal is brought to said second reference voltage level;
a second MOS transistor having its drain electrode and gate electrode connected to the source electrode of said first MOS transistor and its source electrode connected to said first reference voltage terminal, said second MOS transistor being turned off if the level of the output signal supplied through said first MOS transistor means exceeds a predetermined threshold; and
a third MOS transistor connected in parallel with respect to said second MOS transistor and having its gate electrode connected to said second reference voltage terminal, said third MOS transistor being turned on in response to said second reference voltage and generating drain-source resistance to match the characteristic impedance of said load,
wherein said first and second MOS transistors have current handling capabilities such that they drive said load at high speed.

12. The output device according to claim 11, wherein the first MOS transistor included in said high level output circuit and the first MOS transistor included in said low level output circuit have different conductivity types, the second MOS transistor included in said high level output circuit and the second MOS transistor included in said low level output circuit have different conductivity types, and the third MOS transistor included in said high level output circuit and the third MOS transistor included in said low level output circuit have different conductivity types.

13. The output device according to claim 12, wherein the first and second MOS transistors included in said high level output circuit have the same conductivity types and the first and second MOS transistors included in said low level output circuit have the same conductivity types.

14. An output device formed on a semiconductor substrate, comprising:
- an input terminal for receiving an input signal;
- a reference voltage terminal for receiving a reference voltage;
- an output terminal connected to a load;
- a high level output circuit for supplying a signal of high level to said output terminal; and
- a low level output circuit for supplying a signal of low level to said output terminal,
- wherein at least one of said high level output circuit and said low level output circuit comprises:
  - a first transistor means having its gate connected to said input terminal and its drain connected to said reference voltage terminal, said first transistor means being switched in response to said input signal;
  - a second transistor means having its source and gate connected to said output terminal and its drain connected to the source of said first transistor means, said first transistor means being turned off when the level of the potential on said output terminal exceeds a predetermined threshold; and
  - means connected in parallel with said second transistor means for limiting the amount of current passing through said first transistor means when said second transistor means is turned off.

15. A method of operating an output device including an input terminal for receiving an input signal, a reference voltage terminal for receiving a reference voltage, an output terminal connected to a load, a first transistor having its drain connected to said output terminal and its gate connected to said input terminal, and a second transistor having its drain and gate connected to the source of said first transistor and its source connected to said reference voltage terminal, comprising the steps of:
- disconnecting the other end of said first transistor from said reference voltage terminal when the level of an output signal supplied through said first transistor exceeds a predetermined threshold; and
- limiting the amount of current passing through said first transistor when said second transistor is turned off.

* * * * *